United States Patent
Moriyama et al.

(10) Patent No.: US 9,723,232 B2
(45) Date of Patent: Aug. 1, 2017

(54) SOLID-STATE IMAGE SENSOR

(71) Applicant: CANON KABUSHIKI KAISHA, Tokyo (JP)

(72) Inventors: Takashi Moriyama, Yokohama (JP); Kiyofumi Sakaguchi, Miura-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/751,653

(22) Filed: Jun. 26, 2015

(65) Prior Publication Data

US 2016/0014352 A1    Jan. 14, 2016

(30) Foreign Application Priority Data

Jul. 10, 2014  (JP) .................................. 2014-142635

(51) Int. Cl.
*H04N 5/335* (2011.01)
*H01L 27/146* (2006.01)

(52) U.S. Cl.
CPC ......... *H04N 5/335* (2013.01); *H01L 27/1463* (2013.01); *H01L 27/14618* (2013.01); *H01L 27/14643* (2013.01)

(58) Field of Classification Search
CPC ............. H01L 27/146; H01L 27/14601; H01L 27/1463; H01L 27/14643; H01L 27/14818; H01L 27/14647; H01L 27/14652; H01L 27/14659; H01L 27/14618; H04N 5/369; H04N 5/3698; H04N 5/374; H04N 5/3745; H04N 5/335
See application file for complete search history.

(56) References Cited

U.S. PATENT DOCUMENTS

| | | | |
|---|---|---|---|
| 6,815,791 B1 * | 11/2004 | Dierickx | H01L 27/1443 257/215 |
| 8,426,794 B2 * | 4/2013 | Itahashi | H01L 27/14609 250/208.1 |
| 9,431,449 B2 * | 8/2016 | Toda | H01L 27/14603 |
| 2005/0194654 A1 * | 9/2005 | Iguchi | H01L 27/1446 257/458 |

(Continued)

FOREIGN PATENT DOCUMENTS

JP    2004-071817 A    3/2004

OTHER PUBLICATIONS

Takashi Moriyama, et al., U.S. Appl. No. 14/489,812, filed Sep. 18, 2014.

*Primary Examiner* — Albert Cutler
(74) *Attorney, Agent, or Firm* — Fitzpatrick, Cella, Harper & Scinto

(57) ABSTRACT

A solid-state image sensor is provided. The solid-state image sensor includes a substrate. The substrate includes an electrode layer, an insulating layer arranged on the electrode layer, and a semiconductor layer arranged on the insulating layer. The semiconductor layer includes a first semiconductor region of a first conductivity type, a second semiconductor region configured to accumulate charges generated by photoelectric conversion, the second semiconductor region being arranged on the first semiconductor region and having a second conductivity type opposite to the first conductivity type, and a third semiconductor region of the second conductivity type to which the charges accumulated in the second semiconductor region are transferred.

18 Claims, 10 Drawing Sheets

(56) References Cited

U.S. PATENT DOCUMENTS

| | | | |
|---|---|---|---|
| 2006/0125038 A1* | 6/2006 | Mabuchi | H01L 27/14603 257/447 |
| 2006/0187327 A1* | 8/2006 | Mabuchi | H01L 27/14632 348/294 |
| 2009/0201395 A1* | 8/2009 | Manabe | H01L 27/1462 348/294 |

* cited by examiner

SOLID-STATE IMAGE SENSOR

BACKGROUND OF THE INVENTION

Field of the Invention

The present invention relates to a solid-state image sensor.

Description of the Related Art

A solid-state image sensor includes a photoelectric conversion portion formed on a substrate and reads out charges generated by light which has entered this photoelectric conversion portion. Japanese Patent Laid-Open No. 2004-71817 has described the structure of a solid-state image sensor where light which has passed through a photoelectric conversion portion without being converted into charges is reflected by a reflection layer arranged under the photoelectric conversion portion and returned to the photoelectric conversion portion. As a result, efficiency of converting light which has entered the photoelectric conversion portion into charges is improved.

SUMMARY OF THE INVENTION

In a structure described in Japanese Patent Laid-Open No. 2004-71817, light reflected by a reflection layer is converted into charges mainly in the deep portion of a substrate. The present inventors have found that, in the structure described in Japanese Patent Laid-Open No. 2004-71817, it is difficult to collect the charges generated in the deep portion of the substrate, decreasing collection efficiency. As a result, sensitivity is not increased sufficiently in the structure described in Japanese Patent Laid-Open No. 2004-71817. Some embodiments of the present invention provide a technique of increasing collection efficiency of the charges of a solid-state image sensor.

According to some embodiments, a solid-state image sensor includes a substrate. The substrate includes an electrode layer, an insulating layer arranged on the electrode layer, and a semiconductor layer arranged on the insulating layer. The semiconductor layer includes a first semiconductor region of a first conductivity type, a second semiconductor region configured to accumulate charges generated by photoelectric conversion, the second semiconductor region being arranged on the first semiconductor region and having a second conductivity type opposite to the first conductivity type, and a third semiconductor region of the second conductivity type to which the charges accumulated in the second semiconductor region are transferred.

Further features of the present invention will become apparent from the following description of exemplary embodiments (with reference to the attached drawings).

DESCRIPTION OF THE EMBODIMENTS

Concrete embodiments of solid-state image sensors according to the present invention will be described below with reference to the accompanying drawings. The solid-state image sensor manufactured in each embodiment below is a so-called CMOS solid-state image sensor. However, the present invention is not limited to these embodiments. The present invention is also applicable to, for example, a CCD solid-state image sensor.

Figure 1:
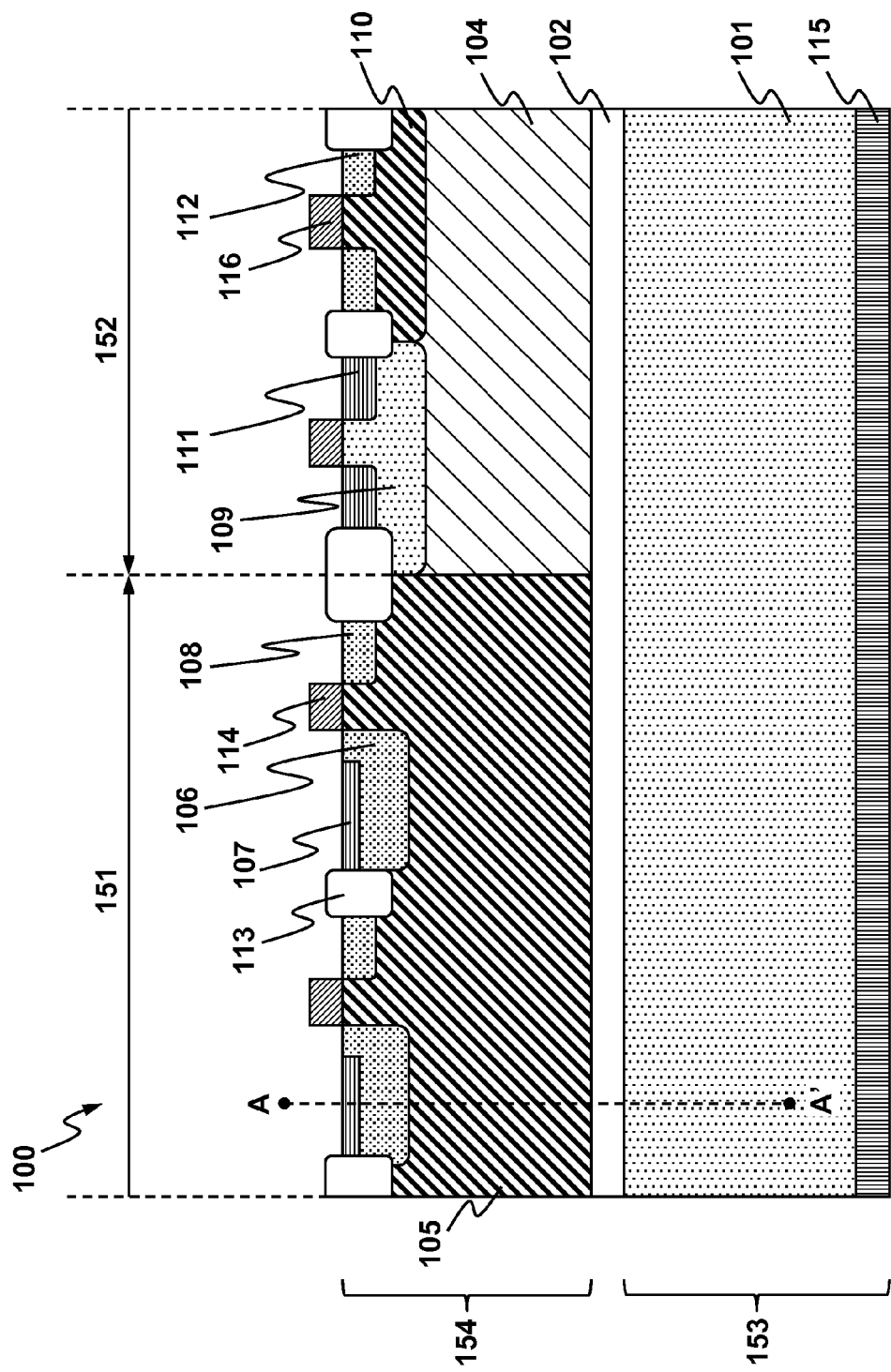
FIG. 1 is a sectional view showing a solid-state image sensor according to an embodiment of the present invention.

A structure and a manufacturing method of a solid-state image sensor 100 according to some embodiments of the present invention will be described with reference to FIGS. 1, 2, and 3A to 3C. FIG. 1 is a sectional view schematically showing an example of the arrangement of the solid-state image sensor 100 according to a first embodiment of the present invention. The solid-state image sensor 100 includes a pixel region 151 where pixels are arrayed and a peripheral region 152 where a peripheral circuit configured to exchange signals between the respective pixels is arranged. Two pixels out of the plurality of pixels arrayed in the pixel region 151 are shown in FIG. 1. The peripheral region 152 includes, for example, a driving circuit unit configured to drive each pixel, a signal processing circuit unit configured to process a signal read out from each pixel, and an output circuit unit configured to output the signal read out from each pixel.

The solid-state image sensor 100 according to this embodiment includes a substrate semiconductor layer 101 of an n-type serving as a second conductivity type and an electrode layer 115 provided under the substrate semiconductor layer 101. A substrate layer 153 is formed by the electrode layer 115 and the substrate semiconductor layer 101. The solid-state image sensor 100 further includes an insulating layer 102 provided on this substrate layer 153 and a semiconductor layer 154 provided on the insulating layer 102. This semiconductor layer 154 includes an n-type semiconductor region 104 and a semiconductor region 105 of a p-type serving as a first conductivity type.

The solid-state image sensor 100 includes the p-type semiconductor region 105 in a pixel region 151. The semiconductor region 105 is adjacent to the semiconductor region 104. In this embodiment, the semiconductor region 105 is positioned adjacent to the insulating layer 102. However, the semiconductor region 105 may be formed, for example, above the insulating layer 102 on the n-type semiconductor region 104. An element or the like which forms each pixel in the pixel region 151 is formed in the semiconductor region 105.

Furthermore, in this embodiment, an n-type semiconductor region 106, a p-type semiconductor region 107, and an n-type semiconductor region 108 are formed in the semiconductor region 105. A gate electrode 114 is formed on a gate insulating film (not shown) on the semiconductor region 105. The respective elements are isolated by an element isolation portion 113. The source region and drain region of a transistor which forms the pixel are formed in the semiconductor region 105.

The solid-state image sensor 100 further includes the n-type semiconductor region 104 in the peripheral region 152. An n-type semiconductor region 109 and a p-type semiconductor region 110 are formed in the n-type semiconductor region 104. Two p-type semiconductor regions 111 are arranged in the n-type semiconductor region 109. A gate electrode 116 is formed on an insulating film (not shown) on the semiconductor region 109. The p-type semiconductor regions 111 and the gate electrode 116 form a pMOS transistor. Two n-type semiconductor regions 112 are arranged in the p-type semiconductor region 110. The gate electrode 116 is formed on an insulating film (not shown) on the semiconductor region 110. The n-type semiconductor regions 112 and the gate electrode 116 form an nMOS transistor. The respective transistors are isolated by the element isolation portion 113.

In this embodiment, the above-described structure of FIG. 1 is used. However, the present invention is not limited to this structure. For example, a structure in which the p type and the n type serving as the conductivity types of the respective semiconductor regions are reversed may be used. Also, only the conductivity type of the n-type semiconductor region 104 may not be an n type but may be changed to a p type or an intrinsic type.

In the pixel region 151 of this embodiment, the semiconductor region 105 is a p-type well, the semiconductor region 106 is an n-type heavily doped impurity region, and the semiconductor region 107 is a p-type heavily doped impurity region. The semiconductor region 105 and the semiconductor region 106 form a pn junction, thereby forming a pn photodiode serving as a photoelectric conversion element. The semiconductor region 106 is a charge accumulation region where charges serving as n-type majority carriers generated in the pn photodiode are accumulated. The semiconductor region 107 is formed such that the semiconductor region 106 is isolated from the interface between a semiconductor and the insulating film. This reduces the components of a dark current. A photoelectric conversion portion is formed by these semiconductor regions 105, 106, and 107. Light that has entered the photoelectric conversion portion is photo-electrically converted, thereby generating charges in an amount corresponding to a light amount. In this embodiment, for example, the n-type semiconductor region 104 may not be formed in the semiconductor layer 154, and each of the semiconductor region 105, the semiconductor region 106, and the semiconductor region 107 may be formed in the p-type semiconductor region.

The n-type semiconductor region 108 is a floating diffusion region. The potential of the semiconductor region 108 is initialized by, for example, a reset transistor (not shown) before reading out the charges generated in the photoelectric conversion portion. An n-type channel is formed, by applying a predetermined voltage to the gate electrode 114, in the vicinity of the upper surface of the semiconductor region 105 under the gate insulating film (not shown). The charges generated in the photoelectric conversion portion and accumulated in the semiconductor region 106 are transferred, via this channel, to the semiconductor region 108 serving as the floating diffusion region. A signal corresponding to the variation amount of the potential by the charges transferred to this semiconductor region 108 is read out as a pixel signal.

The peripheral circuit configured to exchange the signals between the respective pixels is formed in the peripheral region 152. In this embodiment, the transistors included in the peripheral circuit are formed in the n-type semiconductor region 104. However, for example, another semiconductor region having an appropriate impurity concentration may be formed in the n-type semiconductor region 104, and then the transistors included in the peripheral circuit may be formed here. This arrangement makes it difficult for a noise component generated in the peripheral region 152 to enter the semiconductor region 105 of the pixel region 151. This reduces the influence of noise on the pixel region 151.

The manufacturing method of the solid-state image sensor 100 will now be described. The solid-state image sensor 100 is formed by using, for example, an SOI (Semiconductor on Insulator) substrate.

The substrate semiconductor layer 101 of the substrate layer 153 may use a semiconductor substrate which supports the insulating layer 102 of the SOI substrate and the semiconductor layer 154 serving as an SOI layer. An electrical conductive layer such as a metal layer is provided on the back surface of the substrate semiconductor layer 101 serving as this semiconductor substrate by using, for example, a sputtering method or a deposition method, thereby forming the electrode layer 115. The electrode layer 115 may be a heavily doped semiconductor layer having the same conductivity type as the substrate semiconductor layer 101 formed by an ion implantation method, a solid phase diffusion method, or the like.

The semiconductor layer 154 is an epitaxial layer, for example, formed by an epitaxial growth method before a bonding step when manufacturing the SOI substrate by a bonding method. With the epitaxial growth method, it is possible to form a semiconductor region having a low lattice defect density, and to suppress occurrence of lattice defect noise in the pixel region 151 and the peripheral region 152. The n-type semiconductor region 104 of the semiconductor layer 154 may be formed by this epitaxial growth method. In this case, the impurity concentration of the semiconductor region 104 is determined by controlling a dopant concentration in a chamber in epitaxial growth. The semiconductor region 104 may be formed by implanting ions into the semiconductor layer 154 formed by epitaxial growth by, for example, the ion implantation method.

Next, the photoelectric conversion portion and the peripheral circuit are formed in the semiconductor layer 154 where this semiconductor region 104 is formed. The semiconductor region 105 of the pixel region 151 is the p-type well formed in the semiconductor layer 154 by the ion implantation method or the like. The semiconductor regions 106, 107, and 108 which form the pixels are further formed here by the ion implantation method or the like. On the semiconductor region 104 of the peripheral region 152, the semiconductor region 110 serving as a p-type well and the semiconductor region 109 serving as an n-type well are formed by the ion implantation method or the like. Furthermore, the n-type semiconductor regions 112 and the p-type semiconductor regions 111 each serving as a heavily doped impurity region are formed, by the ion implantation method or the like, in the semiconductor region 110 and the semiconductor region 109, respectively. They become the source region and drain region of each transistor.

After that, the gate insulating film (not shown), and the gate electrodes 114 and 116 are formed. Furthermore, an interconnection pattern (not shown) or the like configured to exchange signals between the respective pixels and the peripheral circuit or between peripheral circuits is formed, and the resultant structure is mounted on a package (not shown) or the like. These arrangements can be formed by using an existing method, and thus a detailed description thereof will be omitted. The respective components of the solid-state image sensor 100 shown in FIG. 1 are formed by the above-described steps. However, the present invention is not limited to this manufacturing method as long as the respective components of the solid-state image sensor 100 are formed.

Figure 2:
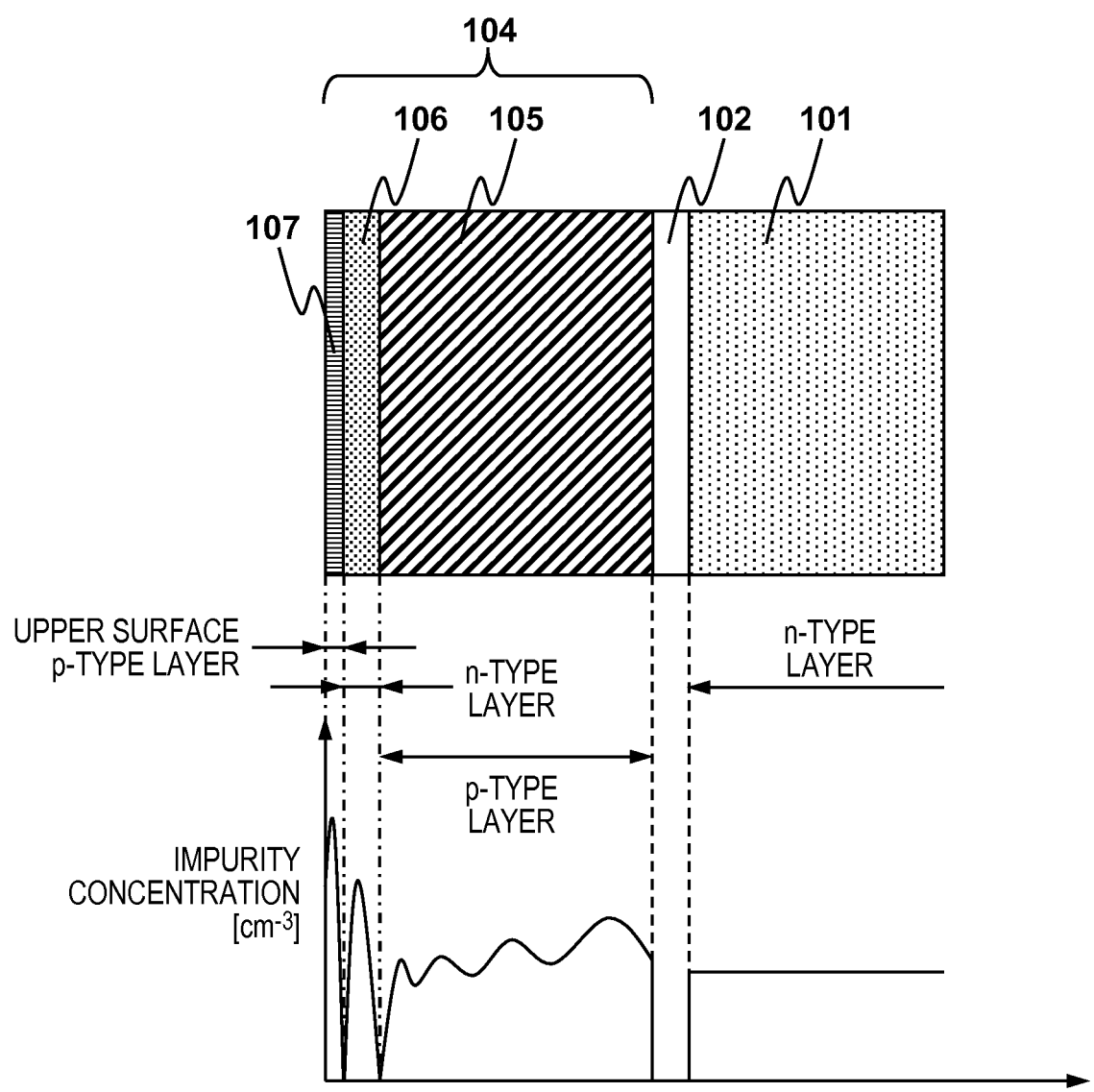
FIG. 2 is a view for explaining the impurity concentration distribution of the solid-state image sensor in FIG. 1.

FIG. 2 is a view for explaining an impurity concentration distribution of each of the semiconductor regions and the insulating layer taken along a broken line A-A' in FIG. 1. A substrate having an n-type impurity concentration of about, for example, $1 \times 10^{14}$ to $1 \times 10^{15}$ cm$^{-3}$ is used for the substrate semiconductor layer 101. The insulating layer 102 is formed on the n-type substrate semiconductor layer 101. The insulating layer 102 forms a high potential barrier for electrons or holes serving as the carriers of the charges generated by light. Therefore, the carriers are not implanted into the insulating layer 102. Also, the carriers cannot move in the insulating layer 102.

The semiconductor region 105 has an impurity concentration of, for example, $1 \times 10^{15}$ to $1 \times 10^{18}$ cm$^{-3}$. The impurity concentration of the semiconductor region 105 may have a gradient which changes the concentration to be lower from the side of the insulating layer 102 to the upper surface, or may be constant in the depth direction. In this embodiment, a concentration gradient is provided as shown in FIG. 2. Providing the concentration gradient in the semiconductor region 105 makes carrier movement easier, and collection efficiency of the carriers generated by light is improved.

Figure 3A:
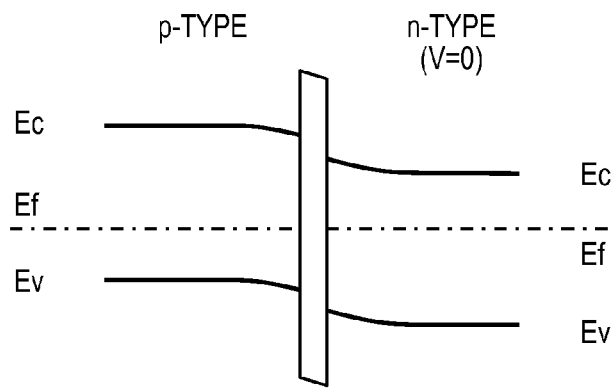
FIGS. 3A to 3C are diagrams each for explaining energy bands in the depth direction of the solid-state image sensor in FIG. 1.
Figure 3B:
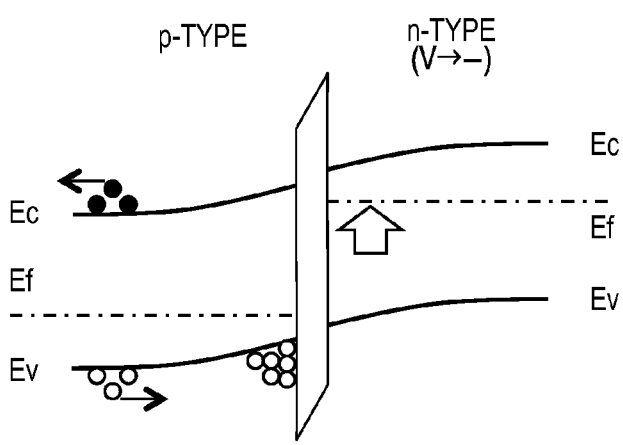
Figure 3C:
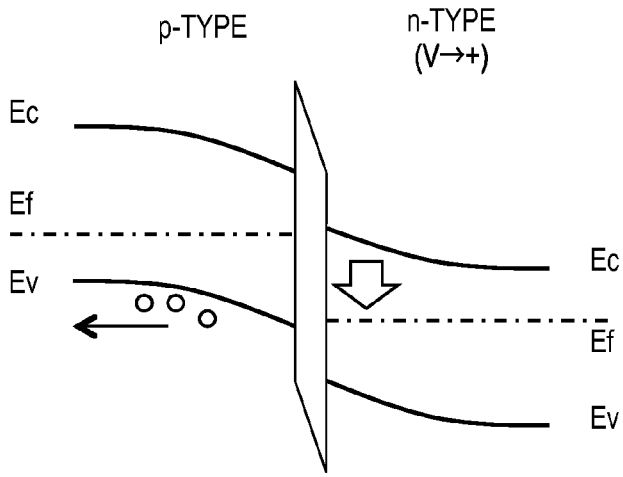

FIGS. 3A to 3C are energy band diagrams of the semiconductor region 105, the insulating layer 102, and the substrate semiconductor layer 101 in a non-operating state, a photoelectric conversion mode, and a refresh mode, respectively, according to this embodiment. Energy band states in the depth direction of the semiconductor region 105, the insulating layer 102, and the substrate semiconductor layer 101 in the pixel region 151 are represented.

FIG. 3A is the energy band diagram when the solid-state image sensor 100 is in the non-operating state. The non-operating state refers to a state in which the solid-state image sensor 100 is not in operation, and neither a signal nor electric power is supplied to the solid-state image sensor 100 from outside. In the non-operating state, a potential is not applied to the electrode layer 115. Therefore, the energy bands corresponding to the respective impurity concentrations are formed in the substrate semiconductor layer 101 and the semiconductor region 105.

FIG. 3B is the energy band diagram when the solid-state image sensor 100 is in the photoelectric conversion mode. The photoelectric conversion mode refers to a mode in which the charges generated in the photoelectric conversion portion are accumulated in the charge accumulation region (semiconductor region 106). In this mode, the transfer transistor of each pixel is kept off. In the photoelectric conversion mode, a negative potential is applied to the electrode layer 115 from outside of the solid-state image sensor 100. According to the potential of the electrode layer 115, the potential of the substrate semiconductor layer 101 becomes lower than that of the semiconductor region 105. Accordingly, a portion of each energy band in the semiconductor region 105 near the insulating layer 102 is bent upward by a potential distribution. When light enters the photoelectric conversion portion in this state, light is also absorbed in the semiconductor region 105, thereby generating electron-hole pairs. In FIGS. 3B and 3C, full circles indicate the electrons and open circles indicate the holes.

The generated electrons are directed to the upper surface side of the pn photodiode by bending of each energy band, and accumulated, as light generation carriers, in the semiconductor region 106 serving as the charge accumulation region. Meanwhile, the generated holes move to the semiconductor region 105 and reach the interface of the insulating layer 102. The holes cannot move beyond the insulating layer 102 because of the high potential barrier of the insulating layer 102. Therefore, the holes stay in the semiconductor region 105. These accumulated holes alleviate bending of each energy band in the portion adjacent to the insulating layer 102 of the semiconductor region 105. However, the generated electrons are sufficiently accumulated in the semiconductor region 106 serving as the charge accumulation region of the pn photodiode. Collection efficiency of the light generation carriers obtained by applying the negative potential to this substrate semiconductor layer 101 is generated similarly in either case in which the impurity concentration distribution in the depth direction of the semiconductor region 105 has the concentration gradient or in which it is constant.

FIG. 3C is the energy band diagram when the solid-state image sensor 100 is in the refresh mode. The refresh mode refers to a mode for removing the charges remaining in the charge accumulation region (semiconductor region 106) after the charges accumulated in the charge accumulation region are transferred to the floating diffusion region (semiconductor region 108). In the refresh mode, a positive potential is applied to the electrode layer 115 from outside of the solid-state image sensor 100. According to the potential of the electrode layer 115, the potential of the substrate semiconductor layer 101 becomes higher than that of the semiconductor region 105. Accordingly, the portion of each energy band in the semiconductor region 105 near the insulating layer 102 is bent downward by the potential distribution. In the refresh mode, the holes accumulated in the vicinity of the insulating layer 102 out of the semiconductor region 105 are directed to the upper surface side by an electric field. The semiconductor region 105 is electrically connected to a terminal provided in order to supply a reset potential. Therefore, the holes flow out to this terminal. At the same time, the electrons are accumulated in the vicinity of the insulating layer 102 of the semiconductor region 105. If this state continues for a sufficient long period of time, the holes of the semiconductor region 105 are swept out.

Figure 10:
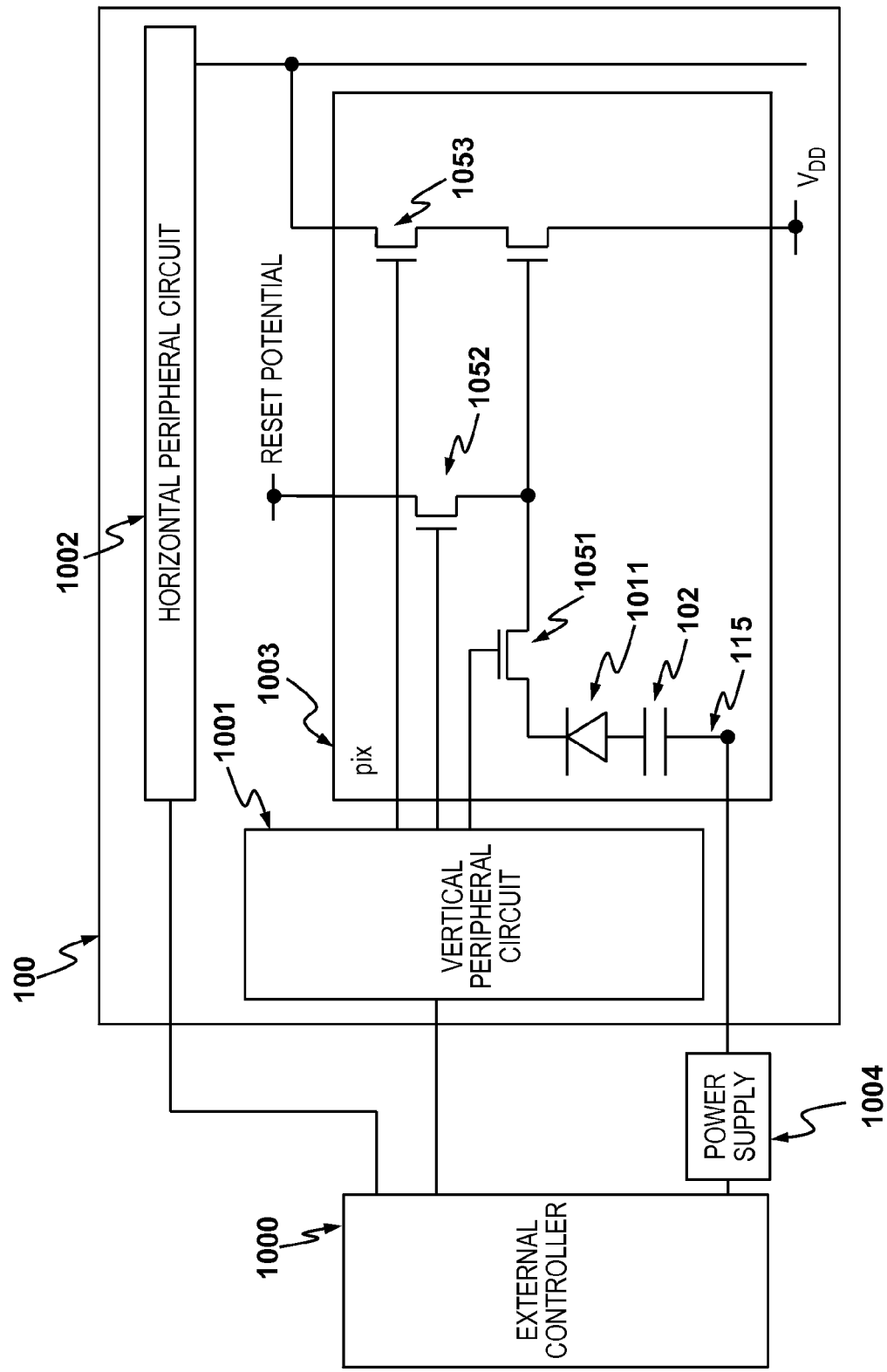
FIG. 10 is a block diagram for explaining the arrangement of the solid-state image sensor in FIG. 1.

FIG. 10 is a block diagram for explaining the arrangement of the solid-state image sensor 100 according to this embodiment. One pixel 1003 is shown here for descriptive simplicity. An external controller 1000 configured to externally control the operation of the solid-state image sensor 100 is connected to the solid-state image sensor 100. A signal from this external controller 1000, and a vertical peripheral circuit 1001 and a horizontal peripheral circuit 1002 each serving as a control unit provided in the peripheral region 152 are operated in synchronism with each other. The external controller 1000 inputs, to each control unit, a signal for setting the solid-state image sensor 100 to the photoelectric conversion mode, and applies the negative potential from a power supply 1004 connected to the external controller 1000 to the electrode layer 115. The vertical peripheral circuit 1001 serving as the control unit turns off a transfer transistor 1051 of the pixel 1003 in accordance with this signal. By doing so, light generation carriers generated by a photoelectric conversion element 1011 are accumulated in the charge accumulation region (semiconductor region 106). After that, the external controller 1000 inputs, to each control unit, a signal for setting the solid-state image sensor 100 to a charge transfer mode, and maintains the negative potential applied to the electrode layer 115. The vertical peripheral circuit 1001 serving as the control unit turns on the transfer transistor 1051 and a selection transistor 1053 of each pixel in accordance with this signal, thereby transferring the charges accumulated in the charge accumulation region (semiconductor region 106) to the horizontal peripheral circuit 1002. After transferring the charges, the external controller 1000 inputs, to each control unit, a signal for setting the solid-state image sensor 100 to the refresh mode, and applies the positive potential to the electrode layer 115. The vertical peripheral circuit 1001 serving as the control unit turns on the transfer transistor 1051 and a reset transistor 1052 in accordance with this signal, thereby emitting the holes accumulated in the vicinity of the insulating layer 102 out of the semiconductor region 105. For example, a camera includes the external controller 1000 and the solid-state image sensor 100 described above.

As described above, it is possible in this embodiment to efficiently direct the light generation carriers generated in the photoelectric conversion portion to the semiconductor region 106 serving as the upper surface-side charge accumulation region by controlling the potential of the substrate semiconductor layer 101 using the electrode layer 115. This improves collection efficiency of the light generation carriers and increases sensitivity of the solid-state image sensor 100. Changing the potential applied to the electrode layer 115 makes it possible to change collection efficiency of the light generation carriers and to change sensitivity of the solid-state image sensor 100 freely. Sensitivity of infrared light can be controlled, in particular, by changing collection efficiency of carriers by long-wavelength light (near infrared light) absorbed in the vicinity of the insulating layer 102 under the semiconductor region 105. This makes it possible to selectively use, in accordance with application, image capturing including only visible light, image capturing including visible light and infrared light, or the like in the same solid-state image sensor.

Figure 4:
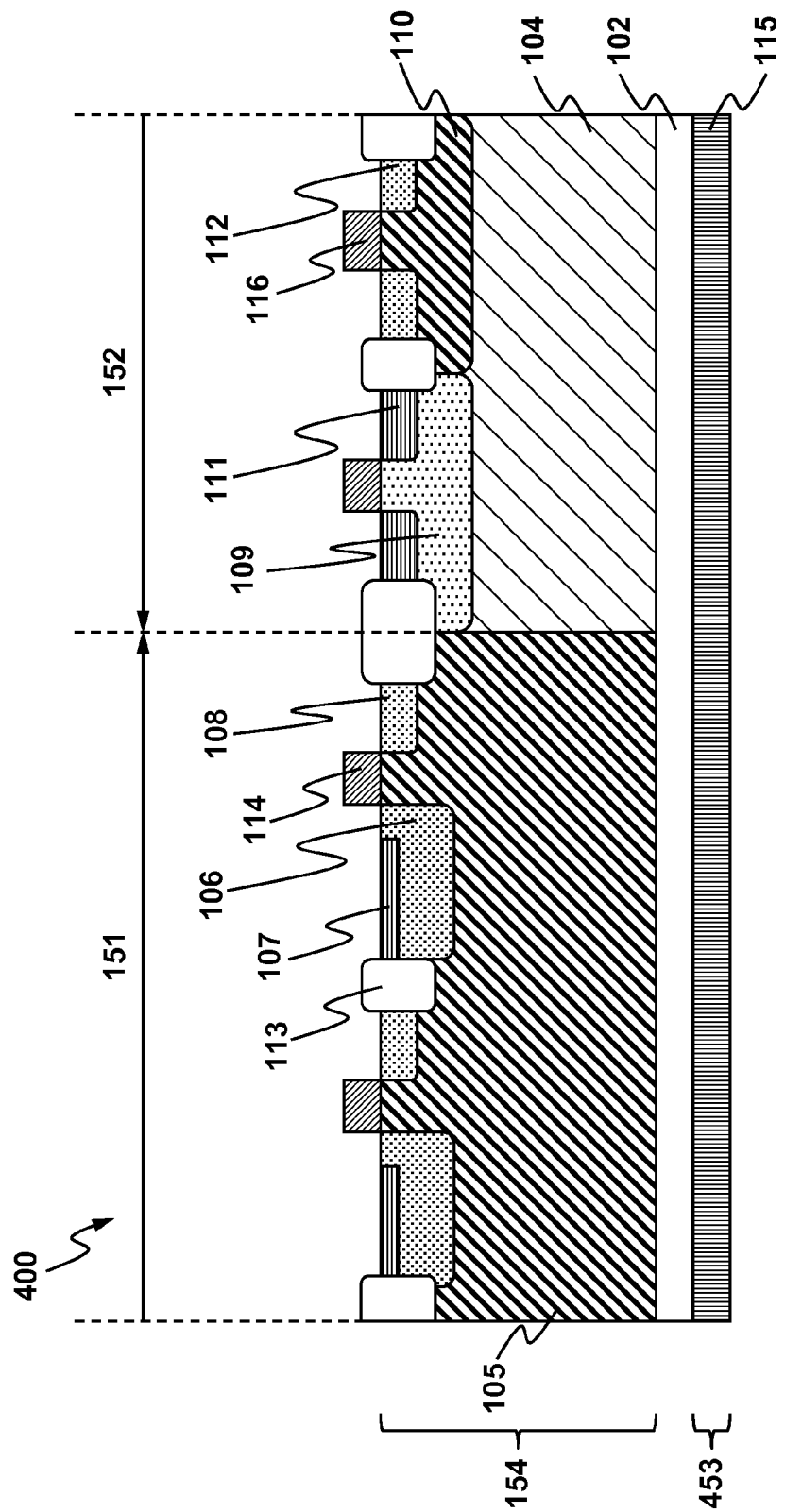
FIG. 4 is a sectional view showing a solid-state image sensor according to an embodiment of the present invention.

A structure and a manufacturing method of a solid-state image sensor 400 according to a second embodiment of the present invention will be described with reference to FIGS. 4 and 5A to 5C. FIG. 4 is a sectional view schematically showing an example of the arrangement of the solid-state image sensor 400 according to the second embodiment of the present invention. In FIG. 4, the solid-state image sensor 400 according to this embodiment is different from the solid-state image sensor 100 according to the first embodiment in that a substrate layer 453 is formed only by an electrode layer 115 and does not include a substrate semiconductor layer 101. The solid-state image sensor 400 may be the same as the solid-state image sensor 100 in other aspects. Therefore, a repetitive description on the same components as in the solid-state image sensor 100 will be omitted. The electrode layer 115 contacts an insulating layer 102.

The manufacturing method of the solid-state image sensor 400 will now be described. Similarly to the solid-state image sensor 100, the solid-state image sensor 400 is formed by using, for example, an SOI substrate. The support substrate of the SOI substrate is removed by a CMP method or the like. An electrical conductive layer such as a metal layer is provided, by using a sputtering method, a deposition method, or the like, under the insulating layer 102 of the SOI substrate whose support substrate has been removed, thereby forming the electrode layer 115. Furthermore, the electrode layer 115 may be formed by, for example, forming a heavily doped semiconductor layer by an ion implantation method, a solid phase diffusion method, or the like, in the semiconductor layer of the support substrate remaining without being removed completely. The solid-state image sensor 400 may also be formed by using, for example, a normal semiconductor substrate. The insulating layer 102 is formed on the back surface of the semiconductor substrate. The electrical conductive layer such as the metal layer is provided under the insulating layer 102 by using the sputtering method, the deposition method, or the like, thereby forming the electrode layer 115. By doing so, the electrode layer 115 which constitutes the substrate layer 453 is formed.

A pixel region 151 and a peripheral region 152 are formed in the same manner as a manufacturing method of the solid-state image sensor 100 except for a step of forming the substrate layer 453. With the above-described steps, the respective components of the solid-state image sensor 400 shown in FIG. 4 are formed. However, the present invention is not limited to this manufacturing method as long as the respective components of the solid-state image sensor 400 are formed.

Figure 5A:
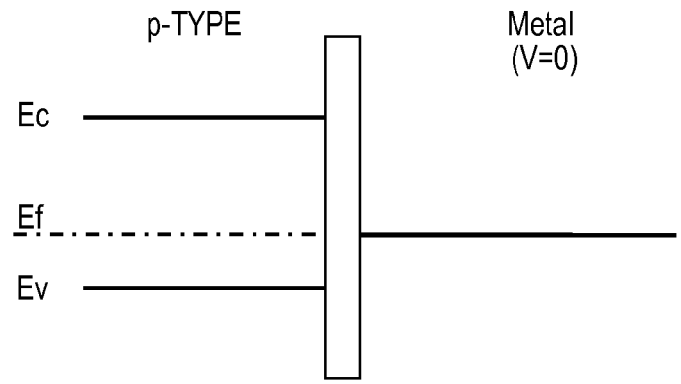
FIGS. 5A to 5C are diagrams each for explaining energy bands in the depth direction of the solid-state image sensor in FIG. 4.
Figure 5B:
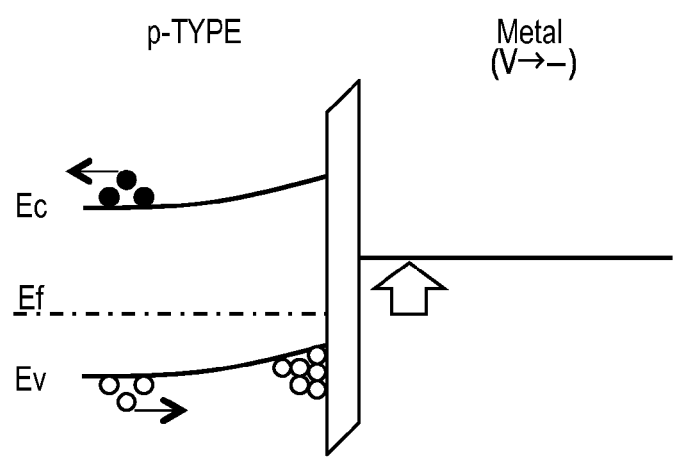
Figure 5C:
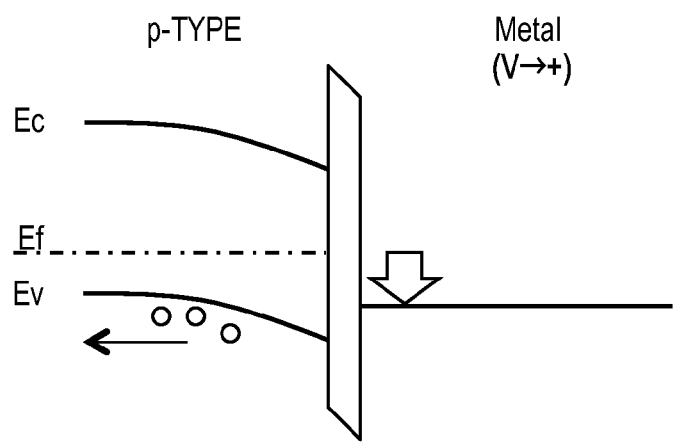

FIGS. 5A to 5C are energy band diagrams of a semiconductor region 105, the insulating layer 102, and the electrode layer 115 in a non-operating state, a photoelectric conversion mode, and a refresh mode, respectively, according to this embodiment. Energy band states in the depth direction of the semiconductor region 105, the insulating layer 102, and the electrode layer 115 in the pixel region 151 are represented.

FIG. 5A is the energy band diagram when the solid-state image sensor 400 is in the non-operating state. In the non-operating state, no potential is applied to the electrode layer 115. Therefore, an energy band corresponding to a work function or a semiconductor impurity concentration is formed in each of the semiconductor region 105 and the electrode layer 115.

FIG. 5B is the energy band diagram when the solid-state image sensor 400 is in the photoelectric conversion mode. In the photoelectric conversion mode, a negative potential is applied to the electrode layer 115 from outside of the solid-state image sensor 400. According to the potential of the electrode layer 115, a portion of each energy band in the semiconductor region 105 near the insulating layer 102 is bent upward by a potential distribution. When light enters the photoelectric conversion portion in this state, light is also absorbed in the semiconductor region 105, thereby generating electron-hole pairs. In FIGS. 5B and 5C, full circles indicate electrons and open circles indicate holes.

The generated electrons are directed to the upper surface side of a pn photodiode by bending of each energy band, and accumulated, as light generation carriers, in the semiconductor region 106 serving as a charge accumulation region. Meanwhile, the generated holes move to the semiconductor region 105 and reach the interface of the insulating layer 102. The holes cannot move beyond the insulating layer 102 because of a high potential barrier of the insulating layer 102. Therefore, the holes stay in the semiconductor region 105. These accumulated holes alleviate bending of each energy band in the portion adjacent to the insulating layer 102 of the semiconductor region 105. However, the generated electrons are sufficiently accumulated in the semiconductor region 106 serving as the charge accumulation region of the pn photodiode. Collection efficiency of the light generation carriers obtained by applying the negative potential to this substrate semiconductor layer 101 is generated similarly in either case in which an impurity concentration distribution in the depth direction of the semiconductor region 105 has a concentration gradient or in which it is constant.

FIG. 5C is the energy band diagram when the solid-state image sensor 400 is in the refresh mode. In the refresh mode, a positive potential is applied to the electrode layer 115 from outside of the solid-state image sensor 400. According to the potential of the electrode layer 115, the portion of each energy band in the semiconductor region 105 near the insulating layer 102 is bent downward by the potential distribution. In the refresh mode, the holes accumulated in the vicinity of the insulating layer 102 out of the semiconductor region 105 are directed to the upper surface side by an electric field. The semiconductor region 105 is electrically connected to a terminal provided in order to supply a reset potential. Therefore, the holes flow out to this terminal. At the same time, the electrons are accumulated in the vicinity of the insulating layer 102 out of the semiconductor region 105. If this state continues for a sufficient long period of time, the holes of the semiconductor region 105 are swept out.

As described above, it is possible in this embodiment to efficiently direct the light generation carriers generated in the photoelectric conversion portion to the semiconductor region 106 serving as the upper surface-side charge accumulation region by controlling the potential of the electrode layer 115. Therefore, the same effect as in the above-described solid-state image sensor 100 can also be obtained in the solid-state image sensor 400.

Figure 6:
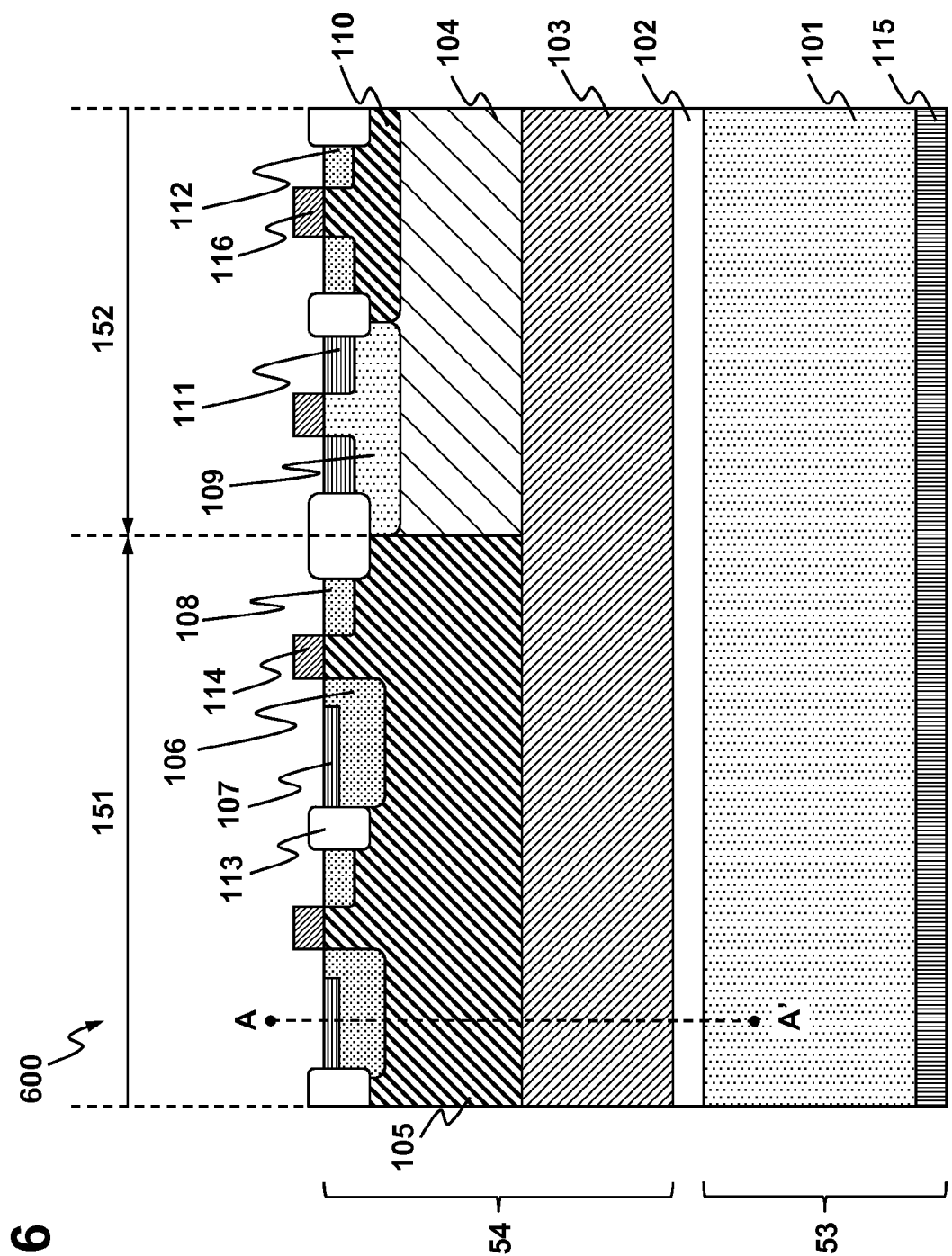
FIG. 6 is a sectional view showing a solid-state image sensor according to an embodiment of the present invention.

A structure and a manufacturing method of a solid-state image sensor 600 according to a third embodiment of the present invention will be described with reference to FIGS. 6, 7, and 8A to 8C. FIG. 6 is a sectional view schematically showing an example of the arrangement of the solid-state image sensor 600 according to the third embodiment of the present invention. In FIG. 6, the solid-state image sensor 600 according to this embodiment is different from the solid-state image sensor 100 according to the first embodiment in that, a p-type semiconductor region 103 is formed between an insulating layer 102, and a semiconductor region 104 and 105 of a semiconductor layer 654. The solid-state image sensor 600 may be the same as a solid-state image sensor 100 in other aspects. Therefore, a repetitive description on the same components as in the solid-state image sensor 100 will be omitted.

In the solid-state image sensor 600 according to this embodiment, a distance of incident light through a photoelectric conversion portion becomes longer than in the first embodiment by providing this p-type semiconductor region 103. Applying this structure makes it possible to absorb longer-wavelength light having a deep penetration depth into the semiconductor layer 654 and to perform photoelectric conversion.

The manufacturing method of the solid-state image sensor 600 will now be described. Similarly to a solid-state image sensor 100, the solid-state image sensor 600 is formed by using, for example, an SOI substrate. A substrate layer 153 of this substrate is formed by using a step similar to that of the solid-state image sensor 100. The semiconductor layer 654 is an epitaxial layer formed by, for example, an epitaxial growth method when forming the SOI substrate. The impurity concentration of the p-type semiconductor region 103 is determined by controlling a dopant concentration in a chamber in epitaxial growth. The n-type semiconductor region 104 and the p-type semiconductor region 105 are formed, by an ion implantation method or the like, on the upper surface side of the semiconductor layer 654 where this semiconductor region 103 is formed. After that, a pixel region 151 and a peripheral region 152 are formed in the same manner as the manufacturing method of the solid-state image sensor 100. With the above-described steps, the respective components of the solid-state image sensor 600 shown in FIG. 6 are formed. However, the present invention is not limited to this manufacturing method as long as the respective components of the solid-state image sensor 600 are formed.

Figure 7:
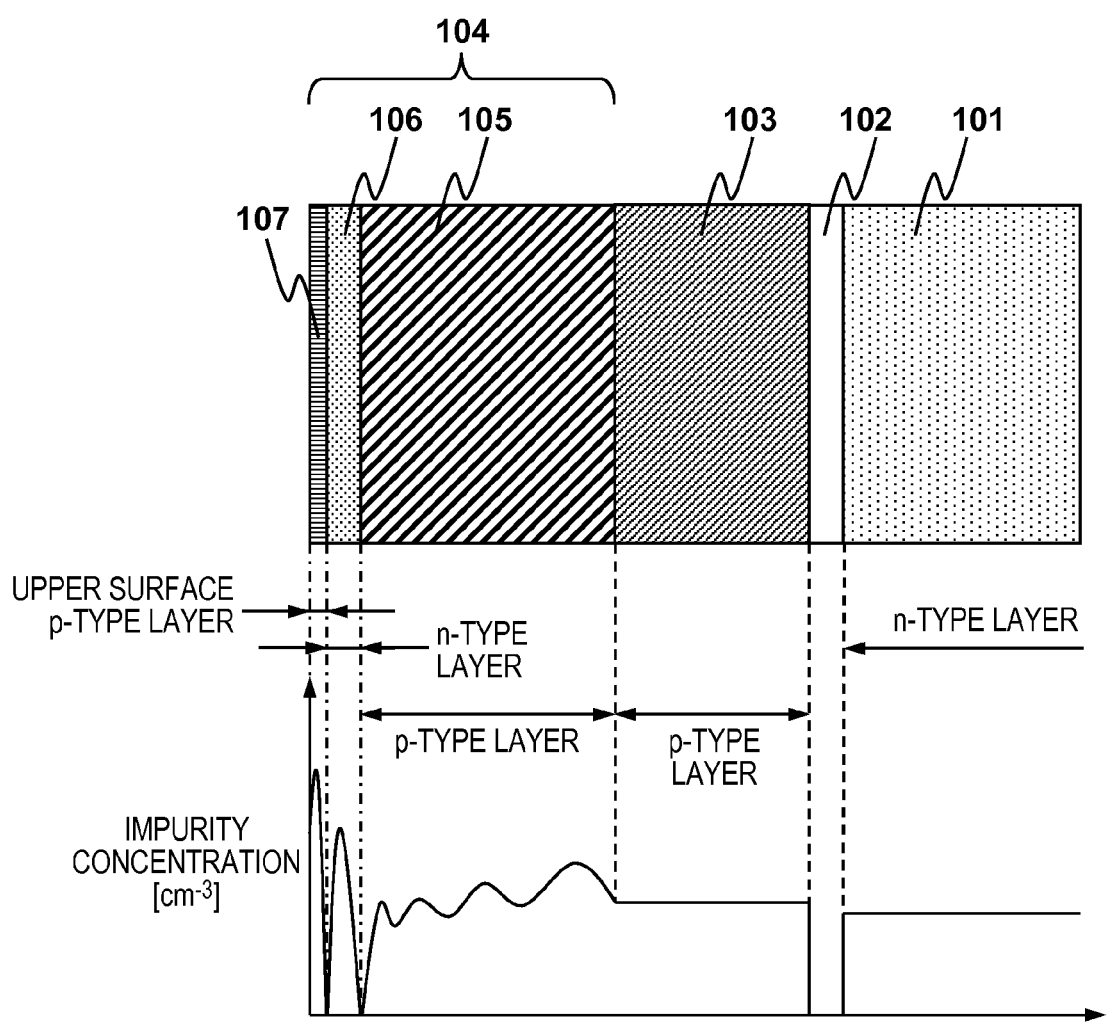
FIG. 7 is a view for explaining the impurity concentration distribution of the solid-state image sensor in FIG. 6.

FIG. 7 is a view for explaining an impurity concentration distribution of each of the semiconductor regions and the insulating layer taken along a broken line A-A' in FIG. 6. The semiconductor region 103 has an impurity concentration of about, for example, $1\times10^{15}$ to $1\times10^{18}$ cm$^{-3}$. In this embodiment, the impurity concentration of the semiconductor region 103 is constant in the depth direction. A concentration gradient may be provided by, for example, controlling a dopant concentration in the chamber in epitaxial growth. The impurity concentration of each semiconductor region other than the p-type semiconductor region 103 may be equal to that of the solid-state image sensor 100.

Figure 8A:
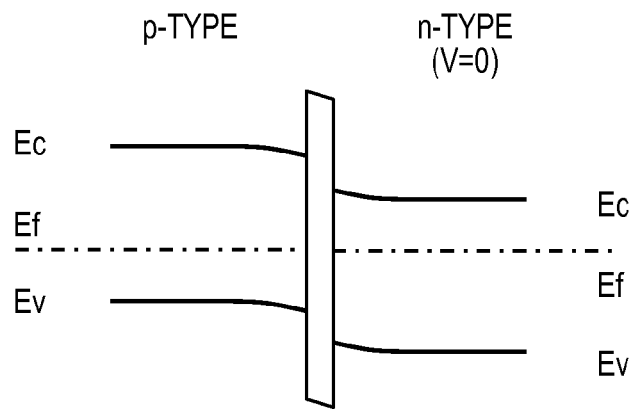
FIGS. 8A to 8C are diagrams each for explaining energy bands in the depth direction of the solid-state image sensor in FIG. 6.
Figure 8B:
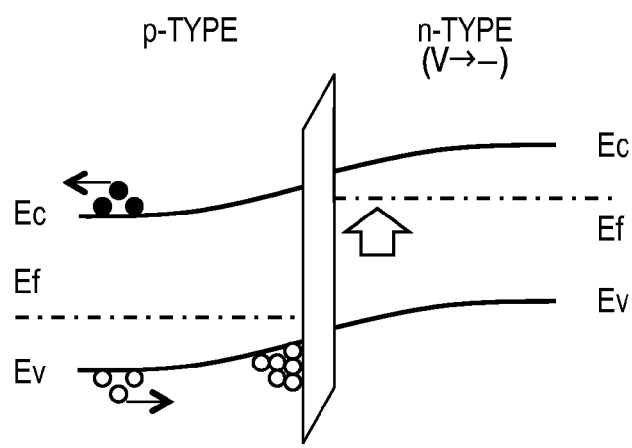
Figure 8C:
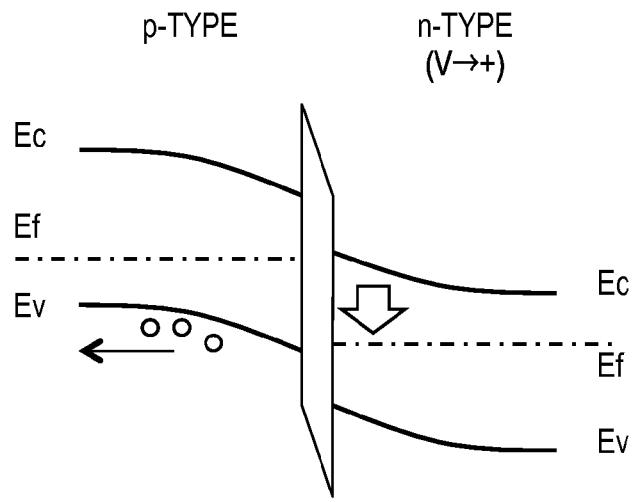

FIGS. 8A to 8C are energy band diagrams of the p-type semiconductor region 103, the insulating layer 102, and the substrate semiconductor layer 101 in a non-operating state, a photoelectric conversion mode, and a refresh mode, respectively, according to this embodiment. Energy band states in the depth direction of the p-type semiconductor region 103, the insulating layer 102, and the substrate semiconductor layer 101 in the pixel region 151 are represented.

FIG. 8A is the energy band diagram when the solid-state image sensor 600 is in the non-operating state. In the non-operating state, no potential is applied to the electrode layer 115. Therefore, an energy band corresponding to each impurity concentration is formed in each of the substrate semiconductor layer 101 and the p-type semiconductor region 103.

FIG. 8B is the energy band diagram when the solid-state image sensor 600 is in the photoelectric conversion mode. In the photoelectric conversion mode, the potential of the substrate semiconductor layer 101 becomes lower than that of the p-type semiconductor region 103, according to the potential of the electrode layer 115. Accordingly, a portion of each energy band in the p-type semiconductor region 103 near the insulating layer 102 is bent upward by a potential distribution. When light enters the photoelectric conversion portion in this state, light is also absorbed in the p-type semiconductor region 103, thereby generating electron-hole pairs. In FIGS. 8B and 8C, full circles indicate electrons and open circles indicate holes.

The generated electrons are directed to the upper surface side of a pn photodiode by bending of each energy band, and accumulated, as light generation carriers, in the semiconductor region 106 serving as a charge accumulation region. Meanwhile, the generated holes move to the semiconductor region 105 and the p-type semiconductor region 103, and reach the interface of the insulating layer 102. The holes cannot move beyond the insulating layer 102 because of a high potential barrier of the insulating layer 102. Therefore, the holes stay in the p-type semiconductor region 103. These accumulated holes alleviate bending of each energy band in the portion adjacent to the insulating layer 102 of the p-type semiconductor region 103. However, the generated electrons are sufficiently accumulated in the semiconductor region 106 serving as the charge accumulation region of the pn photodiode.

FIG. 8C is the energy band diagram when the solid-state image sensor 600 is in the refresh mode. In the refresh mode, a positive potential is applied to the electrode layer 115 from outside of the solid-state image sensor 600. According to the potential of the electrode layer 115, the potential of the substrate semiconductor layer 101 becomes higher than that of the p-type semiconductor region 103. Accordingly, the portion of each energy band in the p-type semiconductor region 103 near the insulating layer 102 is bent downward by the potential distribution. In the refresh mode, the holes accumulated in the vicinity of the insulating layer 102 out of the p-type semiconductor region 103 are directed to the upper surface side of the semiconductor region 105 by an electric field. The semiconductor region 105 is electrically connected to a terminal provided in order to supply a reset potential. Therefore, the holes flow out to this terminal. At the same time, the electrons are accumulated in the vicinity of the insulating layer 102 out of the p-type semiconductor region 103. If this state continues for a sufficient long period of time, the holes of the p-type semiconductor region 103 and the semiconductor region 105 are swept out.

As described above, it is possible in this embodiment to efficiently direct the light generation carriers generated in the photoelectric conversion portion to the semiconductor region 106 serving as the upper surface-side charge accumulation region by controlling the potential of the substrate semiconductor layer 101 using the electrode layer 115. Therefore, the same effect as in the above-described solid-state image sensors 100 and 400 can also be obtained in the solid-state image sensor 600. In the solid-state image sensor 600, a substrate layer 453 of FIG. 4 may be used instead of the substrate layer 153. In this case, the above-described effect can also be obtained.

As described above, since the solid-state image sensor 600 includes the p-type semiconductor region 103, sensitivity of long-wavelength light can be increased. In this embodiment, the thickness of the p-type semiconductor region 103 can be 50 µm or less in order to bend the energy band of the p-type semiconductor region 103 by applying a voltage as low as about 10V or less to the electrode layer 115. The thickness of the p-type semiconductor region 103 may also be 10 µm or less.

The three embodiments according to the present invention has been described above. However, the present invention is not limited to these embodiments. For example, the electrode layer 115 may have a function of reflecting light, in addition to a function serving as an electrode. It is possible to reflect light which has not been absorbed in the photoelectric conversion portion at the time of incidence by using a metal material such as aluminum. This makes it possible to direct light that has not been absorbed to the photoelectric conversion portion again, resulting in an increase in the sensitivity of the solid-state image sensor. Further, the electrode layer 115 may not be formed over the entire solid-state image sensor, unlike in FIGS. 1, 4, and 6. For example, the electrode layer 115 may only be arranged, in planar view, in a position overlapping with the n-type semiconductor region 106 serving as the charge accumulation region of the photoelectric conversion portion in the pixel region 151. Furthermore, the separate electrode layer 115 may be provided, for example, for each pixel. By setting a voltage to be applied to the electrode layer 115 for each pixel, it becomes possible to selectively use, for each pixel, image capturing including only visible light, image capturing including visible light and infrared light, or the like in accordance with application.

Figure 9:
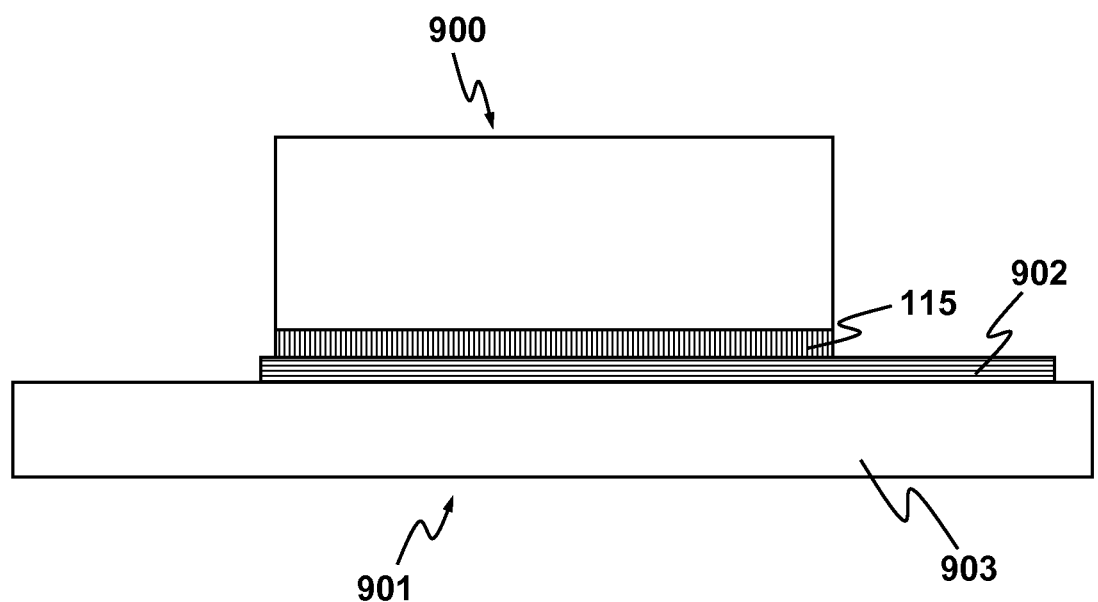
FIG. 9 is a view for explaining a connection between a solid-state image sensor and a support table of the present invention.

Although not shown in the above-described embodiments, a substrate 900 where each pixel, the peripheral circuit, and the like are formed by each step as shown in FIG. 9 is mounted on, for example, a package 901. An electrode 902 is attached to the upper surface of a support table 903 of the package 901, thereby electrically connecting this electrode 902 and the electrode layer 115 of the substrate 900. It is possible to control a potential distribution in the semiconductor region 105 of each of the solid-state image sensors 100, 400, and 600 by controlling a voltage to be applied to the electrode 902.

As an application of the solid-state image sensor according to each embodiment described above, a camera in which this solid-state image sensor is assembled will exemplarily be described below. The concept of the camera includes not only an apparatus mainly aiming at shooting but also an apparatus (for example, a personal computer or a portable terminal) accessorily having a shooting function. The camera may be a module part such as a camera head. The camera includes the solid-state image sensor according to the present invention exemplified as each embodiment described above, and a signal processing unit which processes a signal output from this solid-state image sensor. This signal processing unit can include, for example, a processor which processes digital data based on a signal obtained from the solid-state image sensor. An A/D converter configured to generate this digital data may be provided on a semiconductor substrate of the solid-state image sensor or on another semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-142635, filed Jul. 10, 2014, which is hereby incorporated by reference wherein in its entirety.

What is claimed is:

1. A solid-state image sensor comprising:
   a substrate, the substrate including an electrode layer, a semiconductor layer, and an insulating layer arranged between the electrode layer and the semiconductor layer; and
   a transfer gate electrode,
   wherein the semiconductor layer and the insulating layer are arranged between the electrode layer and the transfer gate electrode,
   wherein the semiconductor layer includes:
      a first semiconductor region of a first conductivity type;
      a second semiconductor region configured to accumulate charges generated by photoelectric conversion, the second semiconductor region having a second conductivity type opposite to the first conductivity type; and
      a third semiconductor region of the second conductivity type to which the charges accumulated in the second semiconductor region are transferred by the transfer gate electrode,
   wherein the first semiconductor region is arranged between the second semiconductor region and the insulating layer and between the third semiconductor region and the insulating layer,
   wherein the second semiconductor region and the third semiconductor region are spaced a distance from the insulating layer by the first semiconductor region, and
   wherein the electrode layer is configured to be applied with a plurality of voltages.

2. The solid-state image sensor according to claim 1, wherein the electrode layer is arranged such that a potential distribution of the first semiconductor region changes via the insulating layer in accordance with a voltage applied to the electrode layer.

3. The solid-state image sensor according to claim 1, wherein a first voltage and a second voltage are selectively applied to the electrode layer,
the first voltage is configured to form, in the first semiconductor region, a potential distribution which drifts first charges in the first semiconductor region to the second semiconductor region, the first charges having a same polarity as majority carriers for the second conductivity type, and
the second voltage is configured to form, in the first semiconductor region, a potential distribution which drifts second charges in the first semiconductor region to the second semiconductor region, the second charges having a same polarity as majority carriers for the first conductivity type.

4. The solid-state image sensor according to claim 3, further comprising a controller configured to accumulate charges in the second semiconductor region when the first voltage is applied to the electrode layer, and configured to emit charges accumulated in the first semiconductor region when the second voltage is applied to the electrode layer.

5. The solid-state image sensor according to claim 1, wherein an impurity concentration of the first semiconductor region has a concentration distribution which drifts charges having a same polarity as majority carriers for the second conductivity type in the first semiconductor region to the second semiconductor region.

6. The solid-state image sensor according to claim 1, wherein the first semiconductor region includes:
a portion of a constant impurity concentration; and
a layer positioned on the portion of the constant impurity concentration and having a concentration distribution which drifts charges having a same polarity as majority carriers for the second conductivity type in the first semiconductor region to the second semiconductor region.

7. The solid-state image sensor according to claim 6, wherein a thickness of the portion of the constant impurity concentration in the first semiconductor region is not more than 50 μm.

8. The solid-state image sensor according to claim 6, wherein a thickness of the portion of the constant impurity concentration in the first semiconductor region is not more than 10 μm.

9. The solid-state image sensor according to claim 1, further comprising, between the electrode layer and the insulating layer, a substrate semiconductor layer formed by a semiconductor.

10. The solid-state image sensor according to claim 9, wherein the substrate semiconductor layer has the second conductivity type.

11. The solid-state image sensor according to claim 1, wherein the electrode layer and the insulating layer are in contact with each other.

12. The solid-state image sensor according to claim 1, wherein the electrode layer is arranged, in a planar view, in a position overlapping with at least the second semiconductor region.

13. The solid-state image sensor according to claim 1, wherein the electrode layer is formed of a metal.

14. The solid-state image sensor according to claim 1, further comprising a package on which the substrate is mounted,
the package including a support table configured to support the substrate and an electrode attached to the support table,
wherein the electrode layer and the electrode are electrically connected to each other.

15. The solid-state image sensor according to claim 1, further comprising a fourth semiconductor region of the first conductivity type on the second semiconductor region.

16. The solid-state image sensor according to claim 1, wherein the electrode layer is a metal layer having a function of reflecting light.

17. The solid-state image sensor according to claim 1, wherein
the first semiconductor region and the second semiconductor region are in contact with each other, and
the first semiconductor region and the insulating layer are in contact with each other.

18. A camera comprising:
a solid-state image sensor defined in claim 1; and
a signal processor configured to process a signal obtained by the solid-state image sensor.

* * * * *